United States Patent
Fukada et al.

(10) Patent No.: US 7,514,272 B2
(45) Date of Patent: Apr. 7, 2009

(54) METHOD OF MANUFACTURING FERROELECTRIC MEMORY DEVICE

(75) Inventors: Shinichi Fukada, Hamura (JP); Hiroyuki Mitsui, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/717,791

(22) Filed: Mar. 13, 2007

(65) Prior Publication Data

US 2007/0218569 A1  Sep. 20, 2007

(30) Foreign Application Priority Data

Mar. 14, 2006  (JP) .............................. 2006-069100

(51) Int. Cl.
*H01L 21/00* (2006.01)
(52) U.S. Cl. .......................... 438/3; 438/240; 438/253; 257/E27.104
(58) Field of Classification Search ............... 438/3, 438/238–241, 253–256, 396–399; 257/E27.104
See application file for complete search history.

(56) References Cited

U.S. PATENT DOCUMENTS

| | | | |
|---|---|---|---|
| 6,576,546 B2 * | 6/2003 | Gilbert et al. | 438/629 |
| 7,176,132 B2 | 2/2007 | Sashida et al. | |
| 2001/0055852 A1 * | 12/2001 | Moise et al. | 438/396 |
| 2002/0072223 A1 * | 6/2002 | Gilbert et al. | 438/629 |
| 2003/0227046 A1 * | 12/2003 | Ando et al. | 257/310 |
| 2006/0043452 A1 | 3/2006 | Ueda | |
| 2006/0046318 A1 | 3/2006 | Ueda | |
| 2006/0183250 A1 * | 8/2006 | Choi et al. | 438/3 |
| 2007/0040198 A1 * | 2/2007 | Matsuura | 257/296 |
| 2007/0090438 A1 * | 4/2007 | Miura | 257/303 |
| 2007/0120165 A1 * | 5/2007 | Matsuura | 257/296 |

FOREIGN PATENT DOCUMENTS

| | | |
|---|---|---|
| JP | 9-252094 | 9/1997 |
| JP | 10-56140 | 2/1998 |
| JP | 10-214944 | 8/1998 |
| JP | 2004-134692 | 4/2004 |
| JP | 2004-186517 | 7/2004 |
| JP | 2006-66514 | 3/2006 |
| JP | 2006-66515 | 3/2006 |
| JP | 2006-066796 | 3/2006 |
| JP | 2006-066797 | 3/2006 |

\* cited by examiner

*Primary Examiner*—H. Jey Tsai
(74) *Attorney, Agent, or Firm*—Harness, Dickey & Pierce, P.L.C.

(57) ABSTRACT

A method of manufacturing a ferroelectric memory device includes: forming an active element on a substrate; forming an interlayer insulating layer on the substrate; forming an opening on the interlayer insulating layer and forming a contact plug inside the opening; forming a foundation layer above the substrate; and laminating, on the foundation layer, a first electrode, a ferroelectric layer, and a second electrode. In this method, the forming of the foundation layer includes: forming a first titanium layer having a thickness less than a depth of a recess; nitriding the first titanium layer into a first titanium nitride layer; forming a second titanium layer on the first titanium nitride layer so as to at least partially fill the recess remaining on the contact plug; nitriding the second titanium layer into a second titanium nitride layer, and polishing a surface of the second titanium nitride layer.

24 Claims, 3 Drawing Sheets

METHOD OF MANUFACTURING FERROELECTRIC MEMORY DEVICE

CROSS-REFERENCE TO RELATED APPLICATION

This application claims priority from Japanese Patent Application No. 2006-069100, filed Mar. 14, 2006, the contents of which are incorporated herein by reference.

BACKGROUND

1. Technical Field

The present invention relates to a method of manufacturing ferroelectric memory devices.

2. Related Art

Ferroelectric memory devices (FeRAM), which are non-volatile memory devices capable of operating at high speeds but at low voltages, are expected to be the future large-capacity non-volatile memory. Their memory cells may be arrayed in the 1 transistor/1 capacitor (1T/1C) configuration, enabling large-capacity integration at the same level as that of DRAM.

To maximize the ferroelectric properties of the ferroelectric capacitors composing a ferroelectric memory device, the crystal orientations in the layers composing a ferroelectric capacitor are critical. Specifically, to control the crystal orientation of the ferroelectric film, crystal orientation and flatness must be controlled from a lower electrode film disposed on the underside of the ferroelectric film.

On the other hand, a stack structure, in which capacitors are formed on contact plugs connected to transistors, is known as a method for improving the integration level of the capacitors as disclosed in Japanese Unexamined Patent Application, First Publication No. 2004-134692.

Regarding capacitors disposed in a stack structure, a ferroelectric film is formed on two different surfaces, namely those of an insulating film and a contact plug. Thereby, controlling the crystal orientations in these films is very important.

There is a problem in that the bottom of a recess, namely a depression, formed on the contact plug must be flat. A satisfactory level of the crystal orientation of the lower electrode formed on the contact plug can not be always be achieved by the conventional art disclosed in Japanese Unexamined Patent Application, First Publication No. 2004-134692 mentioned above, which includes: covering the whole surface of the formed contact plug with a conductive hydrogen barrier film; flattening the whole surface covered with the conductive hydrogen film until the recess is filled using any technique such as CMP; and, forming a lower electrode is formed thereon.

SUMMARY

An advantage of some aspects of the invention is to provide a method of manufacturing ferroelectric memory devices in which it is possible to form a ferroelectric capacitor on a flat surface with its recess completely filled while desirably controlling the crystal orientation in each of the layers composing the capacitor.

A first aspect of the invention provides a method of manufacturing ferroelectric memory devices of this invention, including: forming an active element on a substrate; forming an interlayer insulating layer on the substrate; forming an opening on the interlayer insulating layer and forming a contact plug inside the opening; forming a foundation layer above the substrate; and, laminating, on the foundation layer, a first electrode, a ferroelectric layer, and a second electrode. In this method, the forming of the foundation layer includes: forming, on a surface of the interlayer insulating layer and on a surface of the contact plug, a first titanium layer having a thickness less than a depth of a recess formed on the contact plug; nitriding the first titanium layer into a first titanium nitride layer; forming a second titanium layer on the first titanium nitride layer so as to at least partially fill the recess remaining on the contact plug; nitriding the second titanium layer into a second titanium nitride layer, and polishing a surface of the second titanium nitride layer.

According to the method of this invention, the recess formed on the contact plug may be preferably filled while desirably controlling the ferroelectric layer on both the interlayer insulating layer and the contact plug.

In other words, since the first titanium nitride layer and the second titanium nitride layer are embedded in the recess formed on the contact plug, it is possible to flatten the surface layer of the foundation layer.

In addition, since the foundation layer made of a laminated composite of the first titanium nitride layer and the second titanium nitride layer is disposed on the contact plug, it is possible to control the crystal orientation in the ferroelectric layer on the contact plug.

Specifically, in the forming of the foundation layer, the first titanium later is formed and nitrided into the first titanium nitride layer, and in the same manner, the second titanium layer is formed thereon and nitrided into the second titanium nitride layer to achieve a suitable crystal orientation in the foundation layer.

Usually, titanium with a higher self-orientation characteristic indicates a suitable crystal orientation on amorphous substrates, though even titanium may not well bring out its self-orientation characteristic if a contact plug is formed on a substrate.

On the other hand, according to the method of this invention, a first titanium layer is formed on the interlayer insulating layer and on the contact plug, and is nitrided into a first titanium nitride layer, and a second titanium layer is formed thereon and thereby, even on the contact plug, a base layer on which the second titanium layer is formed is titanium nitride layer, so that the second titanium layer may bring out its self-orientation characteristic reliably. Naturally, the second titanium nitride layer which is produced by nitriding of the second titanium layer has a desirably self-crystal orientation characteristic.

Accordingly, the surface of the foundation layer formed on the crystalline contact plug can retain its high self-crystal orientation characteristic. As a result, a first electrode formed on the foundation layer including the first titanium nitride layer and the second titanium nitride layer laminated so as to embed the recess has a desirably crystal orientation characteristic, which reflects the preferable crystal orientation characteristic of the second titanium nitride layer.

Similarly, a ferroelectric layer formed on the first electrode has the crystal orientation predetermined, which reflects the crystal orientation of the first electrode, achieving ferroelectric memory devices with better ferroelectric characteristics.

On the other hand, according to the art, in which any material is embedded directly in the recess formed on the contact plug, no effect of improvement in crystal orientation characteristic may be achieved on any area other than that on the contact plug, namely the area on the interlayer insulating layer.

According to the method of this invention, in which the titanium nitride layers formed by nitriding the titanium layers are also formed on the interlayer insulating layer and polished, an effect of improvement in crystal orientation characteristic may be obtained in the area of the contact plug, as well as that of the interlayer insulating layer.

By polishing the surface of the second titanium nitride layer, flatness of the titanium nitride layers is improved. It is possible to improve a crystal orientation characteristic in the layers formed thereon.

The crystal plane self-orientation of titanium occurs in the direction of the closest packing plane (001) and when titanium is nitrided, its crystal plane self-orientation changes to the direction (111). According to the method of this invention, in which the first electrode is formed on the titanium nitride layer with crystal orientation (111), the crystal orientation characteristic reflecting the crystal structure of the titanium nitride layers is successfully predetermined to the first electrode. For example, when the first electrode is made of Ir, the first electrode would have the necessary/preferable crystal orientation (111).

Thus, greater improvement of the crystal orientation characteristic of titanium enhances the crystal orientation characteristic to higher levels.

On the other hand, the self-orientation characteristic of titanium is a phenomenon expected only on amorphous substrates (insulating film ($SiO_2$)) with no surface structure and thereby, titanium behaves differently on contact plugs with specific crystal structures (for example, tungsten plugs). On the surfaces with specific crystal structures, titanium would have any crystal orientation reflecting these surface structures.

In this case, since it is impossible to make titanium to be oriented to the crystal orientation (111), it is impossible to control the first electrode so as to be oriented to a predetermined crystal orientation on the titanium nitride layers nitrided from titanium.

To solve this problem, according to the method of this invention, the use of a sequential process includes: a step of forming the first titanium layer; a step of nitriding the first titanium layer into the first titanium nitride layer; and a step of forming the second titanium layer.

In this manner, the self-orientation characteristic of titanium in the foundation layer is developed, regardless of the nature of the substrate surfaces to be fabricated, namely even on contact plugs having specific crystal structures, achieving improvement in crystal orientation characteristic of the first electrode.

The first titanium layer is affected mainly by the uneven surface of the underlying contact plug and transformed into a microcrystal film which does not have a particular orientation, because a metal film, which grows in the form of a column from the side wall of the contact plug until the contact plug hole is filled, prevents a specific crystal plane from growing toward the surface of the contact plug, and also because the side surfaces of a columnar structure, which expose on the surface of the contact plug having minute unevenness covered, prevent a film from forming on a flat surface.

At best, only a titanium film having somewhat predominance in crystal orientation (001) can be obtained, and in this case, minimum interfacial surface energy may be gained.

The first titanium layer is nitrided into a first titanium nitride layer with no crystal orientation or minor orientation (111). In the case in which the second titanium layer is formed on the first titanium nitride layer, it is possible to grow the second titanium layer having crystal orientation (001) so as to gain the minimum interfacial surface energy.

This is because since the surface energy is very high on the surface with unevenness of the first titanium nitride layer formed with random orientation, the formation of the second titanium layer thereon strongly induces a low interfacial surface energy state.

Accordingly, the second titanium layer with the minimum interfacial surface energy (namely, crystal orientation (001)) may be formed and nitrided into a second titanium nitride layer with crystal orientation (111).

This process may also improve the crystal orientation of the first electrode formed on the second titanium nitride layer.

According to the method of this invention for manufacturing ferroelectric memory devices, the recess, in which the first titanium nitride layer and the second titanium nitride layer are embedded, is a depression, in which the surface layer of the contact plug is formed at a level lower than that of the interlayer insulating layer and which is formed by disposing the surface layer of the contact plug at a predetermined depth away from the surface layer of the interlayer insulating layer.

It is preferable that, in the method of manufacturing ferroelectric memory devices of the first aspect of the invention, the surface of the second titanium nitride layer be polished until the first titanium nitride layer formed on the interlayer insulating layer is exposed.

It is preferable that, in the method of manufacturing ferroelectric memory devices of the first aspect of the invention, the surface of the second titanium nitride layer be polished until the first titanium nitride layer formed on the interlayer insulating layer be exposed and so that the second titanium nitride layer remains inside of the recess on the contact plug.

In the case in which a laminated composite of the first titanium nitride layer and the second titanium nitride layer is formed on the interlayer insulating layer including the contact plug in the same manner as that of the method of manufacturing ferroelectric memory devices of this invention, the crystal orientation characteristic can be improved on both the interlayer insulating layer and the contact plug, while the following three problems may arise from the formation of the laminated composite.

First, the surface level of the capacitor becomes higher and the load may increase in the capacitor etching process or later.

Second, the thickness of the titanium nitride layer to be etched in capacitor processing may increase, adding more etching load.

Third, the area of the titanium nitride layer exposing on the sides of the capacitor may increase and the margin of titanium nitride oxidization may decrease.

To solve these problems, according to the method of manufacturing ferroelectric memory devices of this invention, the second titanium nitride layer is polished until the first titanium nitride layer is exposed on the interlayer insulating layer in the polishing of the second titanium nitride layer as described above.

Since satisfactory control of crystal orientation may be achieved only in the interlayer insulating layer on the first titanium nitride layer, the redundant second titanium nitride layer is removed. In this manner, it is possible to solve the aforementioned problems while sufficiently ensuring the crystal orientation characteristic and flatness of the foundation layer.

In the polishing of the second titanium nitride layer, if the second titanium nitride layer is polished until the first titanium nitride layer formed on the interlayer insulating layer is exposed and so that the second titanium nitride layer may remain in the recess formed on the contact plug, the laminated composite of the first titanium nitride layer and the second titanium nitride layer is disposed on the contact plug, while only the first titanium nitride layer is disposed on the interlayer insulating layer, providing control of the crystal orientation, as well as giving a solution to the aforementioned first to third problems.

The nitriding of a titanium layer into a titanium nitride layer may include a performing a heat-treating to the titanium layer in a nitrogen atmosphere.

In this heat-treatment, it is possible to suitably nitride the titanium layer into the titanium nitride layer.

It is preferable that, in the method of manufacturing ferroelectric memory devices of the first aspect of the invention, before the forming of the first titanium layer, an ammonium plasma process be applied onto the interlayer insulating layer.

In this ammonia plasma process, it is possible to modify the amorphous oxidized film surface of the substrate surface with hydrogen so as to strongly accelerate the crystal orientation (001) in a titanium layer formed thereon.

Furthermore, the ammonia plasma process may be applied onto the surface of the second titanium layer prior to being formed as with the first titanium layer. This may bring out the effects of nitrogen modification on a thin amorphous Ti oxidized film, which is formed by natural oxidization of the surface of the first titanium nitride layer in the atmosphere.

It is preferable that the method of manufacturing ferroelectric memory devices of the first aspect of the invention further include forming, on a top surface of the foundation layer, a barrier layer serving as a barrier to oxygen.

Thus, the barrier layer capable of serving as a barrier to oxygen on the top surface of the foundation layer is formed. The formation of this barrier can prevent or suppress contact plugs or the like to be formed on the substrate from being oxidized.

It is preferable that, in the method of manufacturing ferroelectric memory devices of the first aspect of the invention, the barrier layer be made of a compound represented by a chemical formula $Ti_{(1-x)}Al_xN_y(0<x\leq0.3, 0<y)$.

This type of compound, which has the crystal orientation (111) reflecting that of the underlying titanium layer and the first electrode formed thereon has a predetermined crystal orientation reflecting that of the barrier layer.

Furthermore, for the first and second electrodes, for example, any of iridium, platinum, ruthenium, iridium oxides, ruthenium oxides, and platinum alloys may be used.

For the ferroelectric layer, for example, any of perovskite-like oxides including lead zirconate titanate ($Pb(Zr, Ti)O_3$, hereinafter simply referred to as PZT) and laminated bismuth compounds including $SrBi_2Ta_2O_9$ may be used.

In the nitriding of the formed titanium layer, which is a top layer (the second titanium layer), is preferably applied before or after the forming of the first electrode and before the step of forming the ferroelectric layer. In this manner, the effects of annealing at the nitriding step may improve the crystal orientation characteristic of the first electrode and if this process is applied after the formation of the ferroelectric layer, that ferroelectric layer may be damaged when annealed, leading to a deterioration in the ferroelectric characteristic.

DESCRIPTION OF EXEMPLARY EMBODIMENTS

Now, by reference to the accompanying drawings herein, a preferable embodiment of this invention is described in detail below.

Ferroelectric Memory Device

Figure 1:
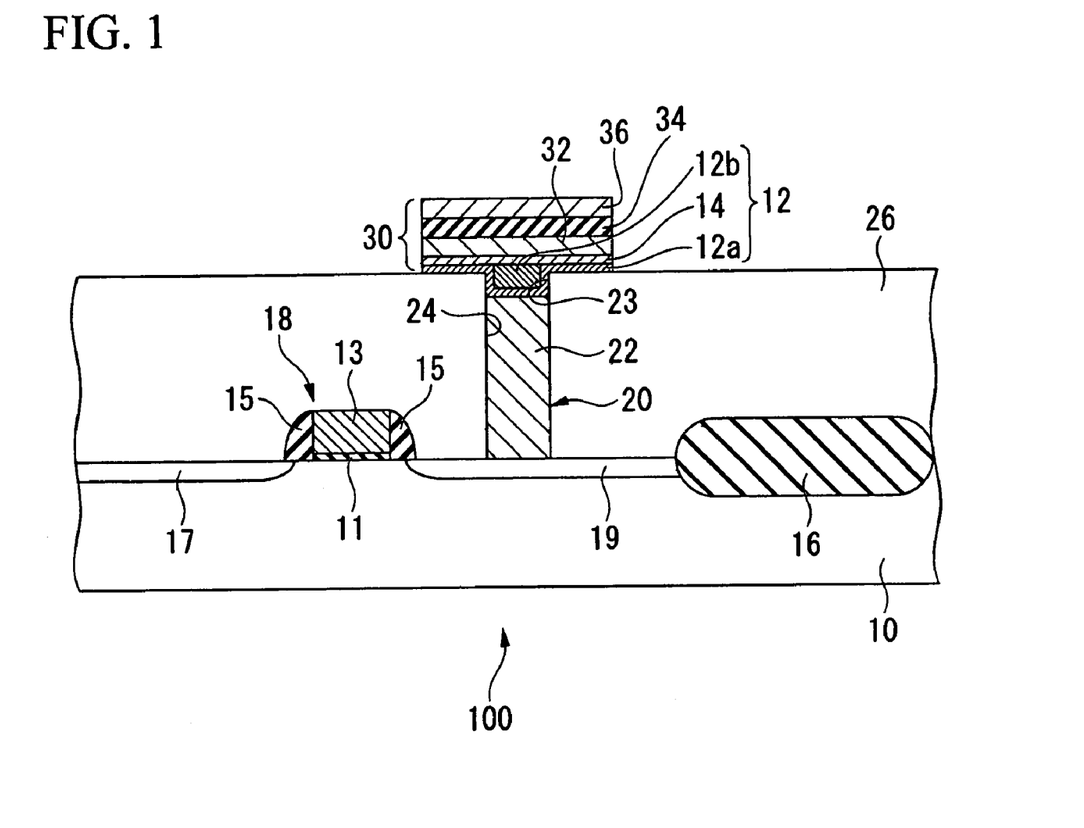
FIG. 1 is a schematic cross-sectional view of a ferroelectric memory device according to an embodiment of this invention.

FIG. 1 is a schematic cross-sectional view of a ferroelectric memory device 100 according to an embodiment of the manufacturing method of this invention.

As shown in FIG. 1, the ferroelectric memory device 100 includes a semiconductor substrate 10, a ferroelectric capacitor 30, a plug (contact plug) 20, and a switching transistor 18 of the ferroelectric capacitor 30. The ferroelectric capacitor 30, the plug 20, and the switching transistor 18 are formed on the semiconductor substrate 10.

This embodiment is described to give an informative example, however this invention is not limited to a 1T/1C configuration.

A switching transistor 18 includes a gate insulating layer 11, a gate conductive layer 13 deposited on the gate insulating layer 11, a first impurity region 17 which is source region, and a second impurity region 19 which is drain regions.

The plug 20 is electrically connected to the switching transistor 18 and disconnected from its neighboring transistor (not shown) by an element separation region 16.

The ferroelectric capacitor 30 includes a foundation layer 12, a first electrode 32 laminated on the foundation layer 12, a ferroelectric layer 34 laminated on the first electrode 32, and a second electrode 36 laminated on the ferroelectric layer 34. The ferroelectric capacitor 30 is disposed on the plug 20 formed on an insulating layer 26.

The plug 20 formed on the second impurity region 19 includes an opening 24 (contact hole) and a plug conductive layer 22 deposited inside the opening 24.

The plug conductive layer 22 may be made of any of high-melting metals such as tungsten, molybdenum, tantalum, titanium, and nickel. It is preferable that the plug conductive layer 22 made of tungsten.

A recess 23 is formed on the plug 20. The recess 23, which is required in the manufacturing process, is a depression formed so that the surface layer of the plug 20 is formed inside an interlayer insulating layer 26 at a predetermined depth when the surface layer of the plug 20 is etched down to the predetermined depth away from the surface layer of the interlayer insulating layer 26 in the manufacturing process. The depth is, for example, approximately 30-60 nm (typically, approximately 40 nm).

The foundation layer 12 includes a first titanium nitride layer 12a formed on the plug 20, a second titanium nitride layer 12b formed on a predetermined position of the first titanium nitride layer 12a, a barrier layer 14 laminated on the first titanium nitride layer 12a and second titanium nitride layer 12b.

The recess 23 formed on the plug 20 has the first titanium nitride layer 12a and second titanium nitride layer 12b embedded. Specifically, the first titanium nitride layer 12a has a thickness thinner than the depth of the recess 23 (for example, approximately 5-30 nm (preferably, 25 nm)) and covers the inner surface of the recess 23 across the surface layer of the insulating layer 26. On the other hand, the second titanium nitride layer 12b is confined to and embedded in the inside of the recess 23 so as to form a continuous flat plane from the surface layer of the first titanium nitride layer 12a disposed on the insulating layer 26.

The thickness of the first titanium nitride layer thinner than the depth of the recess is intended to retain the second titanium nitride layer. In other words, even if the first titanium nitride layer is accidentally removed when the second titanium nitride layer is removed in the area other than the inside of the recess, the second titanium nitride layer remains inside the recess.

The advantages of this invention may not be expected when the first titanium nitride layer is removed together with the second titanium nitride layer and in this case. The removal of the first titanium nitride layer may be easily detected by means of a visual examination. Accordingly, the thickness of the first titanium nitride layer thinner than the depth of the recess ensures the implementation of the structure according to this invention. On the other hand, even if the second titanium nitride layer has not been completely removed and partially remains in an area other than the inside of the recess, it is not a critical problem. This, however, is not preferable from the standpoint of increased inconsistency in capacitance, leading to amplified variation in capacitance due to the coexistence of an original capacitor formed on the first titanium nitride layer excluding the inside of the recess and the capacitor formed on the second titanium nitride layer. Usually, since the speed, at which the titanium nitride layer is removed, considerably decreases at an interface area between the second titanium nitride layer and the first titanium nitride layer, it is possible to make the process easier that the second titanium nitride layer is removed on the flat area and then the first titanium nitride layer is partially removed.

Figure 2:
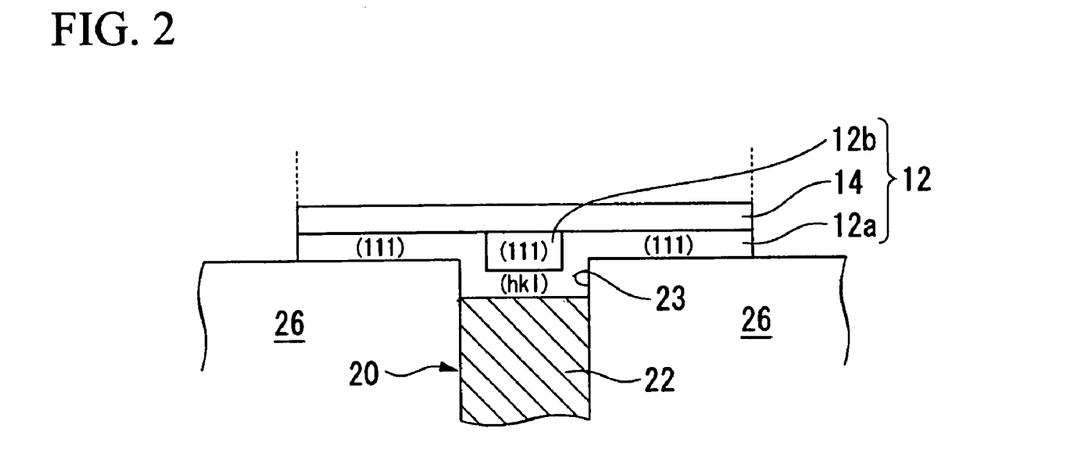
FIG. 2 is a schematic cross-sectional view of the orientation mode of the relevant part of the ferroelectric memory device in FIG. 1.

As shown in FIG. 2, the first titanium nitride layer 12a (the first TiN layer) of the foundation layer 12 has a crystal structure on the insulating layer 26 and the plane crystal orientation (111). On the plug 20 (the inside of the recess 23), however, the first titanium nitride layer 12a has a microcrystal structure with almost no crystal orientation, namely has no predetermined plane orientation. The first titanium nitride layer 12a having such a crystal orientation may be obtained by forming a titanium layer followed by nitriding the formed titanium layer as described in detail later.

The second titanium nitride layer 12b (the second TiN layer) disposed on the first titanium nitride layer 12a (on the opposite side of the plug 20) inside the recess 23 may be obtained by forming a titanium layer followed by nitriding the formed titanium layer as described in detail later.

The barrier layer 14 is formed on the second titanium nitride layer 12b.

The material for the barrier 14 containing a crystalline material, which preferably has the plane crystal orientation (111) but not limited to this orientation because of its function as a barrier to oxygen, has conducting properties. The material for the barrier layer 14 includes, for example, TiAlN, TiAl, TiSiN, TiN, TaN, and TaSiN and preferably contains titanium, aluminum, and nitrogen (TiAlN).

In the case in which the barrier layer 14 made of TiAlN, the composition ratio (the atomic ratio) among titanium, aluminum, and nitrogen of the barrier layer 14 is $0<x\leq0.3$ and preferably $0<y$ assuming that the composition of the barrier layer 14 is represented by means of the chemical formula $Ti_{(1-x)}Al_xN_y$.

Furthermore, to form the first electrode 32 having crystal orientation reflecting that of the barrier layer 14 on the barrier layer 14, the thickness of the barrier layer 14 is preferably 50 to 200 nm.

The barrier layer 14 containing any crystalline material has preferably the crystal orientation (111). The crystal orientation (111) of the barrier layer 14 enables the first electrode 32 with crystal orientation reflecting that of the barrier layer 14 to be formed on the barrier layer 14, imparting the crystal orientation (111) to the first electrode 32.

The first electrode 32 may be made of at least one kind of metal selected from a group of platinum, ruthenium, rhodium, palladium, osmium, and indium, or any of the oxides or alloys of these metals, preferably of platinum or iridium, more preferably iridium. The first electrode 32 may be either a single layer film or a laminated multi layer film. For the first electrode containing any crystalline material, the first electrode 32 and the barrier layer 14 have preferably the crystal orientations in the epitaxial growth direction at the interface between each other. Similarly, the ferroelectric layer 34 and the first electrode 32 has preferably the crystal orientations in the epitaxial growth direction at the interface between each other.

In the case where the barrier layer 14 belongs to a cubic system and has crystal orientation (111) or belongs to a hexagonal system and has crystal orientation (001), the first electrode 32 has preferably the crystal orientation (111). In this configuration, it is easier for the ferroelectric layer 34 to have the crystal orientation (111) in forming the ferroelectric layer 34 on the first electrode 32.

The ferroelectric layer 34 contains a ferroelectric material. The ferroelectric material has a perovskite-like crystal structure as represented by a general formula $A_{1-b}B_{1-a}X_aO_3$. A contains Pb. Alternatively, La may be substituted for part of Pb. B is composed of at least one of Zr and Ti. X is composed of at least one of V, Nb, Ta, Cr, Mo, W, Ca, Sr, and Mg. As the ferroelectric material contained in the ferroelectric layer 34, any of known materials, which are allowed to use for ferroelectric layers, may be used including $(Pb(Zr,Ti) O_3)(PZT)$, $SrBi_2Ta_2O_9(SBT)$, and $(Bi,La)_4Ti_3O_{12}(BLT)$.

Among them, PZT is preferable for the material as the ferroelectric layer 34 and iridium is more preferable for the material as the first electrode 32 from the standpoint of element reliability.

When PZT is used for the ferroelectric layer 34, the content of titanium in PZT is preferably more than that of zirconium to acquire a larger scale of spontaneous polarization. PZT having such a composition belongs to a tetragonal system and spontaneously polarizes along its "c" axis in a crystallographic axis. In this case, since a component having the crystal orientation along an "a" axis intersecting with the "c" axis simultaneously exists, the component having the crystal orientation along the "a" axis does not contribute to polarization inversion when PZT is oriented to the "c" axis orientation, the ferroelectric properties may be deteriorated. In contrast, PZT used for the ferroelectric layer 34 may have the crystal orientation (111) to displace the "a" axis by a predetermined angle from its reference normal. In other words, the polarization axis has a component in the direction of the reference normal, contributing to polarization inversion. Accordingly, for the ferroelectric layer 34 made of PZT, which contains more titanium than zirconium, PZT has preferably the crystal orientation (111) from the standpoint of better hysteresis characteristic being achieved.

A second electrode 36 may be made of any selected from the group of metals listed as allowed in the description of the first electrode 32 or any of aluminum, silver, nickel, or the like. The second electrode 36 may be either a single layer film or a laminated multi layer film. It is preferable that the second electrode 36 be made of platinum, or a laminated layer composed of iridium oxide and iridium.

Regarding the ferroelectric capacitor 30 having such a structure of the ferroelectric memory device 100 according to this invention, since the first electrode 32 is formed on the plug 20 via the foundation layer 12 (composed of the first titanium nitride layer 12a, the second titanium nitride layer 12b, and the barrier layer 14), the first electrode 32 and the ferroelectric layer 34 do not reflect the crystal orientation of the plug 20. In other words, even though the ferroelectric capacitor 30 is formed on the plug 20, the first electrode 32 and the ferroelectric layer 34 reflect the crystal orientation of the foundation layer 12 instead of that of the underlying layer (the plug 20).

It is assumed that the first electrode 32 of the ferroelectric capacitor 30 is disposed directly on a plug conductive layer 22 of the plug 20. In this case, the plug conductive layer 22, if made of a material with a higher crystalline characteristic, may affect the crystal orientation of the first electrode 32. For example, assuming that the plug conductive layer 22 of the plug 20 is made of tungsten with a higher crystalline characteristic, when the first electrode 32 is disposed directly on the plug conductive layer 22 made of tungsten, the crystal structure of the plug conductive layer 22 affects that of the first electrode 32, therefore it is difficult to fabricate the first electrode 34 in a desired crystal structure. Furthermore, since the ferroelectric layer 34 is formed on the first electrode 32, the crystal orientation of the first electrode 32 may affect that of the ferroelectric layer 34. In this case, since the crystal orientation of the ferroelectric layer 34 reflects that of the first electrode 32, polarization occurs in an undesired direction, leading to deterioration in hysteresis characteristic of the ferroelectric capacitor 30.

In contrast, the ferroelectric capacitor 30, in which the first electrode 32 is formed on the plug 20 via the foundation layer 12, according to the embodiment of this invention, the crystal orientation of the plug conductive layer 22 of the plug 20 is prevented from being reflecting in those of the first electrode 32 and the ferroelectric layer 34. This achieves a ferroelectric capacitor 30 with suitable hysteresis characteristic.

More specifically, the foundation layer 12 includes at least the first titanium nitride layer 12a and the second titanium nitride layer 12b laminated thereon. As seen from the plug 20, the first titanium nitride layer 12a and the second titanium nitride layer 12b are embedded in the recess 23 so that the second titanium nitride layer 12b may cancel the influence by the crystal structure of the plug 20, being imparted the crystal orientation in the plane direction (111).

In other words, since the second titanium nitride layer 12b of the foundation layer 12 embedded in the recess 23, which is closer to the first electrode 32, spontaneously cancels the influence by the crystal structure of the plug 20 and has the plane crystal orientation (111), the orientation characteristic of the first electrode 32, as well as the ferroelectric layer 34, is improved, bringing fully out the ferroelectric properties.

In particular, when the recess 23 is filled with a single layer composed of the first titanium nitride layer 12a, the crystal orientation of that first titanium nitride layer 12a may be affected by the crystal structure of the plug 20, but according to the embodiment of this invention, the recess 23 is filled with a laminated layer composed of a titanium nitride layer and thereby, the crystal structure of the plug 20 has almost no effect.

Furthermore, according to the embodiment of this invention, as mentioned above, the recess 23 formed on the plug 20 is filled with the first titanium nitride layer 12a and the second titanium nitride layer 12b. The first titanium nitride layer 12a and the second titanium nitride layer 12b flattens the surface of the foundation layer 12, on which the first electrode 32 is formed, further improving the crystal orientation characteristic of that first electrode 32.

Method of Manufacturing Ferroelectric Memory Devices

Next, an example of the method of manufacturing a ferroelectric memory device 100 as shown in FIG. 1 is described by reference to the accompanying drawings herein. FIGS. 3A to 4D are schematic cross-sectional views of a manufacturing process of the ferroelectric memory device 100 in FIG. 1. In FIGS. 3A to 4D, only the area neighboring the insulating layer 26 and the plug 20 of the ferroelectric memory device 100 are shown.

The method of manufacturing the ferroelectric memory device 100 in this mode includes: a step of forming a transistor (active element) 15 on a substrate 10; a step of forming the interlayer insulating layer 26 on a substrate 19; a step of forming the plug 20 on the interlayer insulating layer 26; a step of forming the foundation layer 12 on the substrate (on the interlayer insulating layer containing the plug 20); and a step of laminating the first electrode 32 (the lower electrode), the ferroelectric layer 34, and the second electrode 36 (the upper electrode).

In particular, as shown in FIGS. 3A to 3E, the step of forming the foundation layer 12 includes a step of forming a first titanium layer 112a, a step of nitriding the first titanium layer 112a into a titanium nitride layer 12a, a step of forming a second titanium layer 112b on the titanium nitride layer 12a, a step of nitriding the second titanium layer 112b into a titanium nitride layer 12b, a step of polishing the surface layer of the titanium nitride layer 12b, and a step of forming the barrier layer 14.

Figure 3A:
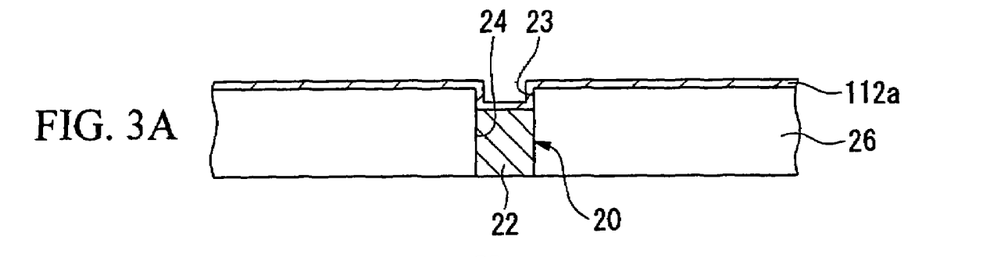
FIGS. 3A to 3E are schematic cross-sectional views of a manufacturing process for the ferroelectric memory device in FIG. 1.

First, prior to the step of forming the foundation layer 12, the transistor 18 (active element) is formed an the substrate 10 by a known method, the interlayer insulating layer 26 on the substrate 10 containing the transistor 18 is formed, an opening 24 (contact hole) is formed in the interlayer insulating layer by etching or the like, and the plug 20 is formed by embedding the plug conductive layer 22 for making conduction with the transistor 18 inside the contact hole 24 (see FIG. 1). The plug conductive layer 22 is embedded by, for example, the CVD or sputtering technique and the plug conductive layer 22 laminated on the top surface of the insulating layer 26 is removed by, for example, the chemical-mechanical polishing technique to form the plug 20. As shown in FIG. 3A, in this case, the recess 23, which is a depression of the plug conductive layer 22 at a predetermined depth away from the surface layer of the interlayer insulating layer 26, is formed on the plug 20.

The interlayer insulating layer 26 is made of silicon oxide film and the plug conductive layer 22 is made of tungsten.

According to the embodiment of this invention, the ammonium plasma process is applied onto the interlayer insulating layer 26 containing the aforementioned plug 20. Specifically, ammonium gas plasma is excited and radiated onto the interlayer insulating layer 26 containing the aforementioned plug 20. This ammonium plasma process is applied under the conditions, for example, 1 Torr of chamber pressure, 300 to 500° C. of substrate temperatures, 50 to 200 W of plasma power, and 60 seconds of plasma radiation time duration.

In the aforementioned manner by the ammonium plasma process, the substrate surface is hydrogen-modified excluding the area on the plug to control the crystal orientation of the first titanium layer to be formed thereon. Following the step of forming the plug, the step is performed as shown in FIGS. 3A to 4D to form the ferroelectric capacitor 30.

First, as shown in FIG. 3A, the first titanium layer 112a is deposited on the substrate 10 (specifically, on the insulating layer 26 and the plug 20). The method for depositing the first titanium layer 112a includes the sputtering and CVD technique. Titanium, which has generally high self-orientation characteristic, forms a layer having a hexagonal close-packed structure with crystal orientation (001) when deposited into a film by the sputtering or CVD technique. Accordingly, the first titanium layer 112a formed on the amorphous interlayer insulating layer 26 exhibits the crystal orientation (001) because of its self-orientation characteristic. On the other hand, though the ammonium plasma process is performed, the first titanium layer 112a is affected by the crystal structure of the plug conductive layer 22 formed thereunder, does not exhibit a suitable orientation (001), and indicates a random-ordered orientation.

According the embodiment of this invention, the first titanium layer 112a is formed along the inner surface of the recess 23 formed on the plug 20, namely across the wall surface of the recess 23 or the surface of the insulating layer 26 from the surface layer of the plug conductive layer 22. The thickness of the first titanium layer 112a is adjusted so that it may be thinner than the depth of the recess 23 in film deposition.

Figure 3B:
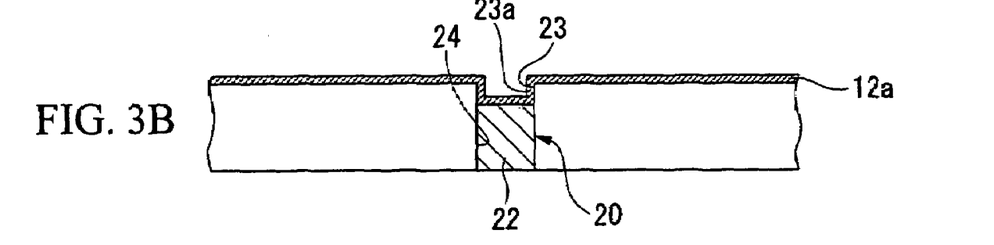

Next, the nitriding process is applied onto the formed first titanium layer 112a to nitride it into the first titanium nitride layer 12a as shown in FIG. 3B. Specifically, the first titanium layer 112a is heat-treated (at 500 to 600° C.) in the nitrogen atmosphere to nitride it. A heating temperature above 650° C. may affect the characteristics of the transistor 18, while the heating temperature under 500° C. takes longer time to nitride the first titanium layer 112a, both of which are not desirable. In such a nitriding process, the part of the first titanium nitride layer 12a with crystal direction (001) on the interlayer insulating layer 26 changes its crystal direction to (111), while the part on the plug 20 remains random-ordered in orientation. As shown in FIG. 3B, the first titanium nitride layer 12a is formed along the inner surface of the recess 23 and the recess 23a is further formed on that first titanium nitride layer 12a.

Figure 3C:
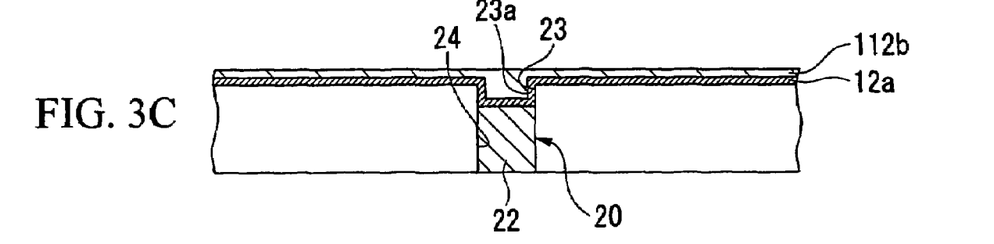

Next, as shown in FIG. 3C, the second titanium layer 112b is formed on the formed first titanium nitride layer 12a by the sputtering or CVD technique in the same manner as that described above. In this case, the thickness of the second titanium layer 112b is adjusted so that the recess 23 may be filled with the second titanium layer 112b, namely the recess 23a formed on the first titanium nitride layer 12a may be filled.

In this case, the second titanium layer 112b is affected by the crystal structure of the underlying first titanium nitride layer 12a and exhibits crystal orientation (001) even on the first titanium nitride layer 12a with crystal orientation (111). On the other hand, the second titanium layer 112b formed on the first titanium nitride layer 12a having a random-ordered orientation indicates the crystal orientation (001) because of its self-orientation characteristic. This means the repeated process of forming the titanium layers may clear any effects by the crystal structure of the plug 20, improving the crystal characteristic on the plug 20.

Figure 3D:
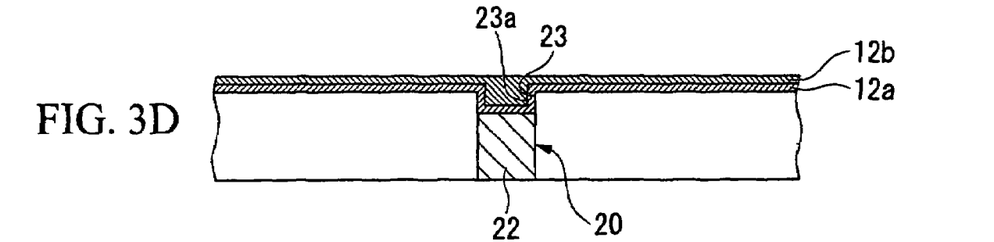

The formed second titanium layer 112b is nitrided into the second titanium nitride layer 12b as shown in FIG. 3D. Similarly, the second titanium layer 112b is heat treated (at 500 to 600° C.) in the nitrogen atmosphere to nitride it. This nitriding process provides the crystal orientation of the second titanium layer 112b to change the crystal orientation (111) as with the first titanium nitride layer 12a. Alternatively, the nitriding process may be applied after the barrier layer 14 described later or the first electrode 32 is formed.

According to the embodiment of this invention, the titanium layer formed on the first titanium nitride layer 12a is nitrided but alternatively, the titanium nitride layer is directly formed by, for example, the reactive sputtering technique.

Figure 3E:
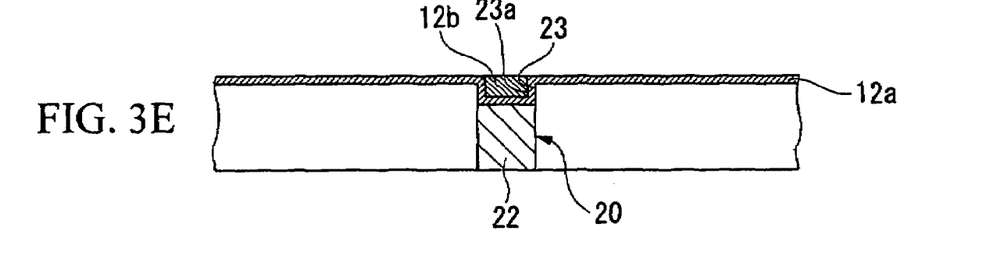

Next, as shown in FIG. 3E, a step of polishing the surface of the formed second titanium nitride layer 12b is performed. According to the embodiment of this invention, the second titanium nitride layer 12b is polished by the CMP (chemical-mechanical polishing) technique so that the first titanium nitride layer 12a may be exposed formed on the insulating layer 26 and part of the second titanium nitride layer 12b may remain inside the recess 23 (the recess 23a formed of the first titanium nitride layer 12a) on the plug 20 as shown in FIG. 3E.

This polishing process provides a first titanium nitride layer 12a with a high crystal orientation characteristic to be exposed on the insulating layer 26, enabling the crystal orientation of the film formed thereon to be suitably controlled. Moreover, since the surface of the first titanium nitride layer 12a is polished, its physical flatness is improved, achieving high orientation control performance compared with those formed on the titanium nitrides layer without polishing.

On the other hand, although the second titanium nitride layer 12b remains thick on the plug 20 due to the existence of the recess 23 (the recess 23a formed on the first titanium nitride layer 12a). The crystal orientation characteristic of the film formed on the first titanium nitride layer 12a may be improved by polishing the recess 23 on the plug 20 to improve its flatness even at a level lower than that on the insulating layer 26.

Figure 4A:
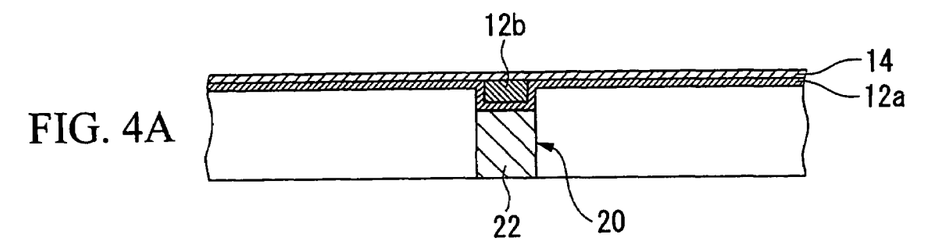
FIGS. 4A to 4D are schematic cross-sectional views of a manufacturing process for the ferroelectric memory device in FIG. 1.

Next, as shown in FIG. 4A, the barrier layer 14 is formed on the polished surface layer, namely on the first titanium nitride layer 12a formed on the insulating layer 26 and on the second titanium nitride layer 12b formed on the plug 20. This enables the barrier layer 14 with the crystal orientation (111) reflecting that (111) of the first titanium nitride layer 12a and the second titanium nitride layer 12b to be formed. This means that the barrier layer 14 may be formed at the interface between the first titanium nitride layer 12a and the second titanium nitride layer 12b and the barrier layer 14 in the epitaxial growing because the lattice structures of the first titanium nitride layer 12a and the second titanium nitride layer 12b match that of the barrier layer 14.

The method for depositing the barrier layer 14 may be selected as needed depending on the material used including the sputtering and CVD techniques. As described above, the barrier layer 14 has preferably a crystalline characteristic and more preferably with crystal orientation (111).

For example, when the barrier layer 14 composed of a layer containing titanium, aluminum, and nitrogen is formed, the barrier layer 14 may be made of TiAlN with crystal orientation (111). The crystal orientation (111) of the barrier layer 14 makes the crystal of first electrode 32 to impart the crystal orientation (111).

Accordingly, the ferroelectric layer 34 formed on the first electrode 32 may have the crystal orientation (111).

As described above, for the ferroelectric layer 34 made of PZT containing more titanium than zirconium, the PZT material has preferably the crystal orientation (111) from the standpoint of better hysteresis characteristic achieved.

Accordingly, the crystal orientation (111) of the barrier layer 14 enables both the first electrode 32 and the ferroelectric layer 34 to have the crystal orientation (111), achieving the ferroelectric capacitor 30 with a superior hysteresis characteristic. The substrate temperature is not particularly limited at the step of forming the barrier layer 14 and may be selected ranging from room temperature to 500° C., for example, if applicable.

Figure 4B:
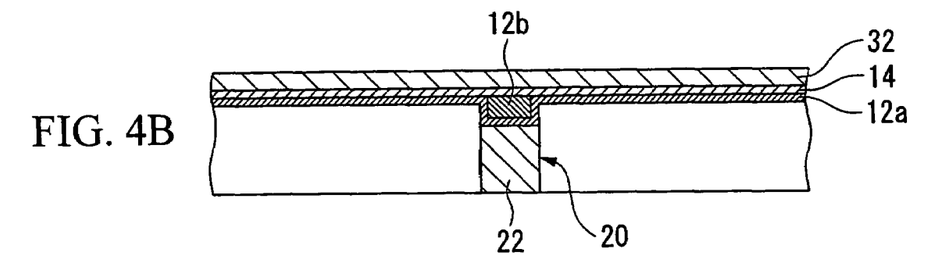

Next, as shown in FIG. 4B, the first electrode 32 is formed on the barrier layer 14. According to the embodiment of this invention, the formation of the first electrode 32 on the crystalline barrier layer 14 improves the crystalline characteristic of the first electrode 32 significantly and enables the crystal orientation of the barrier layer 14 to be reflected in the first electrode 32. For example, when the barrier layer 14 has the crystal orientation (111), the first electrode 32 may also have the crystal orientation (111). The method for depositing the ferroelectric layer 32 may be selected as needed depending on the material used including the sputtering and CVD techniques.

Figure 4C:
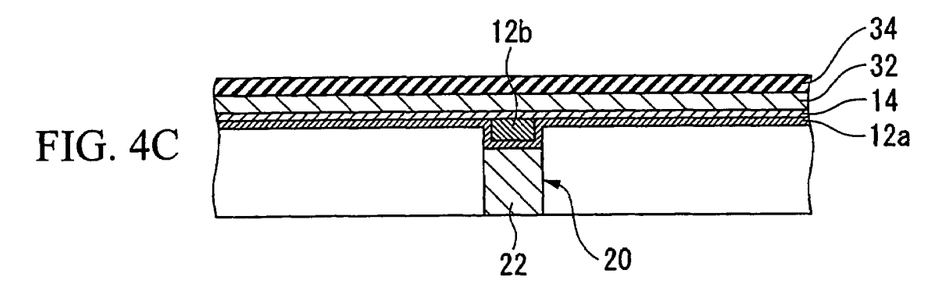

Next, as shown in FIG. 4C, the ferroelectric layer 34 is formed on the first electrode 32. According to the embodiment of this invention, the formation of the ferroelectric layer 34 on the first electrode 32 enables the crystal orientation of the first electrode 32 to be reflected in the ferroelectric layer 34. For example, when the first electrode 32 has the crystal orientation (111), the ferroelectric layer 34 may also have the crystal orientation (111). The method for depositing the ferroelectric layer 34 may be selected as needed depending on the material used including the spin-on, sputtering, and MOCVD techniques.

Figure 4D:
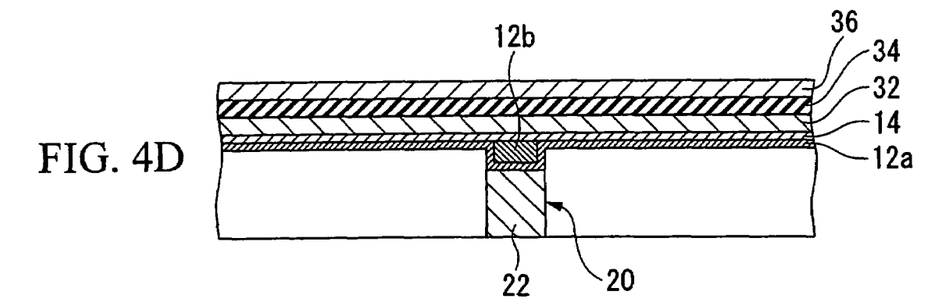

Next, as shown in FIG. 4D, the second electrode 36 is formed on the ferroelectric layer 34. The method for depositing the second electrode 36 may be selected as needed depending on the material used including the sputtering and CVD techniques. Following the depositing step, a resist layer with a predetermined pattern formed thereon is formed on the second electrode 36 and using this resist layer as a mask, a patterning process is applied by photolithography. This achieves a ferroelectric memory device 100 containing the laminated ferroelectric capacitor 30 (see FIG. 1). The ferroelectric capacitor 30 contained in the ferroelectric memory device 100 includes the first electrode 32 formed on the barrier layer 14, the ferroelectric layer 34 formed on the first electrode 32, and the second electrode 36 formed on the ferroelectric layer 34.

The ferroelectric memory device 100 manufactured in this embodiment described above according to the method of this invention has the following effects.

First, the first titanium layer 112a is formed on the substrate 10, the first titanium layer 112a is nitrided, and the second titanium layer 112b is further formed on the first titanium nitride layer 12a and thereby, the self-orientation characteristic of that second titanium layer 112b induces a higher crystal orientation on the plug 20.

Following the step of nitriding the second titanium layer 112b with a higher crystal orientation characteristic into the second titanium nitride layer 12b, the barrier layer 14 may be formed on the second titanium nitride layer 12b and the first titanium nitride layer 12a to reflect the superior crystal orientation characteristic of the second titanium nitride layer 12b in that barrier layer 14. Next, the formation of the first electrode 32 and the ferroelectric layer 34 on the barrier layer 14 achieves the first electrode 32 and the ferroelectric layer 34 with crystal orientation reflecting that of the barrier layer 14. This enables the ferroelectric memory device 100 with a superior hysteresis characteristic to be obtained.

In particular, the barrier layer 14 with crystal orientation (111) is disposed to make it easier for the first electrode 32 and the ferroelectric layer 34 to have the crystal orientations (111). This enables the ferroelectric capacitor 30 with a superior hysteresis characteristic to be formed.

Furthermore, the recess 23 formed on the plug 20 is filled with the second titanium nitride layer 12b and the first titanium nitride layer 12a with an improved crystal orientation characteristic to flatten the surface, on which the barrier layer 14 is formed, namely the surface, on which the first electrode is formed. This flattening process improves the crystal orientation characteristic of the barrier layer 14, the first electrode 32, and the ferroelectric layer 34.

The embodiment according to this invention has been described but this invention is not limited to the aforementioned embodiment.

For example, according to the aforementioned embodiment, the second titanium layer 112b is nitrided into the second titanium nitride layer 12b to be disposed under the barrier layer 14 of the foundation layer 12 prior to the step of forming the barrier layer 14 but alternatively, the nitriding step may be performed after the step of forming the first electrode 32 and before the step of forming the ferroelectric layer 34.

In this case, the annealing process applied to the first electrode 32 improves the crystal orientation characteristic of that first electrode 32 and avoids any damage to the ferroelectric layer 34 by annealing, preventing its ferroelectric characteristic from deteriorating.

What is claimed is:

1. A method of manufacturing a ferroelectric memory device, comprising:
   forming an insulating layer having an opening above a substrate;
   forming a plug in the opening, an upper surface of the plug being lower than an upper surface of the insulating layer;
   forming a first layer including titanium on the insulating layer and the plug, the first layer having a recess;
   forming a second layer including titanium on the first layer;
   polishing the second layer,
   forming a first electrode layer above the second layer;
   forming a ferroelectric layer on the first electrode layer; and
   forming a second electrode layer on the ferroelectric layer,
   wherein the forming of the first layer includes:
      forming a first titanium layer with surface orientation on the plug and the insulating layer; and
      converting the first titanium layer into a first nitride titanium layer with surface orientation (111) by nitriding the first titanium layer.

2. The method according to claim 1, further comprising:
   performing an ammonium plasma process to the insulating layer before the forming of the first layer.

3. The method according to claim 2, wherein the performing of the ammonium plasma process includes:
   exciting ammonium gas plasma; and
   radiating the ammonium gas plasma onto the insulating layer.

4. The method according to claim 1, wherein
   the first layer is formed with a first thickness, and the first thickness is less than a distance from the upper surface of the plug to the upper surface of the insulating layer.

5. The method according to claim 1, wherein
   the second layer is formed so that the recess is filled with the second layer.

6. The method according to claim 1, further comprising:
   forming a barrier layer above the part of the first layer and the second layer after the polishing of the second layer.

7. The method according to claim 6, further comprising:
   forming a ferroelectric capacitor by etching the second electrode layer, the ferroelectric layer, the first electrode, the barrier layer, and the first layer.

8. The method according to claim 6, wherein the barrier layer includes TiAlN.

9. The method according to claim 1, further comprising:
   forming a ferroelectric capacitor by etching the second electrode layer, the ferroelectric layer, the first electrode layer and the first layer.

10. The method according to claim 1, wherein the substrate includes a transistor having a source and a drain.

11. The method according to claim 10, wherein the plug is electrically connected to the source or the drain.

12. The method according to claim 1, wherein the second layer includes a third nitride titanium layer, and the third nitride titanium layer is formed by a reactive sputtering method.

13. A method of manufacturing a ferroelectric memory device, comprising:
    forming an insulating layer having an opening above a substrate;
    forming a plug in the opening, an upper surface of the plug being lower than an upper surface of the insulating layer;
    forming a first layer including titanium on the insulating layer and the plug, the first layer having a recess;
    forming a second layer including titanium on the first layer;
    polishing the second layer;
    forming a first electrode layer above the second layer;
    forming a ferroelectric layer on the first electrode layer; and
    forming a second electrode layer on the ferroelectric layer, wherein
    the forming of the second layer includes:
        forming a second titanium layer with surface orientation (001) on the first layer; and
        converting the second titanium layer into a second nitride titanium layer with surface orientation (111) by nitriding the second titanium layer.

14. The method according to claim 13, further comprising:
performing an ammonium plasma process to the insulating layer before the forming of the first layer.

15. The method according to claim 14, wherein the performing of the ammonium plasma process includes:
    exciting ammonium gas plasma; and
    radiating the ammonium gas plasma onto the insulating layer.

16. The method according to claim 13, wherein the first layer is formed with a first thickness, and the first thickness is less than a distance from the upper surface of the plug to the upper surface of the insulating layer.

17. The method according to claim 13, wherein the second layer is formed so that the recess is filled with the second layer.

18. The method according to claim 13, further comprising:
    forming a barrier layer above the part of the first layer and the second layer after the polishing of the second layer.

19. The method according to claim 18, further comprising:
    forming a ferroelectric capacitor by etching the second electrode layer, the ferroelectric layer, the first electrode layer, the barrier layer, and the first layer.

20. The method according to claim 18, wherein the barrier layer includes TiAlN.

21. The method according to claim 13, further comprising:
    forming a ferroelectric capacitor by etching the second electrode layer, the ferroelectric layer, the first electrode layer, and the first layer.

22. The method according to claim 13, wherein the substrate includes a transistor having a source and a drain.

23. The method according to claim 22, wherein the plug is electrically connected to the source or the drain.

24. The method according to claim 13, wherein the second layer includes a third nitride titanium layer, and the third nitride titanium layer is formed by a reactive sputtering method.

* * * * *